United States Patent [19]

Sano et al.

[11] Patent Number: 5,616,932
[45] Date of Patent: Apr. 1, 1997

[54] AMORPHOUS SILICON GERMANIUM FILM AND SEMICONDUCTOR DEVICE USING THE SAME

[75] Inventors: Keiichi Sano; Yoichiro Aya, both of Osaka-fu, Japan

[73] Assignee: Sanyo Electric Co., Ltd., Osaka-fu, Japan

[21] Appl. No.: 342,734

[22] Filed: Nov. 21, 1994

[30] Foreign Application Priority Data

Nov. 22, 1993 [JP] Japan ................................. 5-292003

[51] Int. Cl.$^6$ .................. H01L 29/04; H01L 31/036; H01L 31/0376; H01L 31/20
[52] U.S. Cl. ........................... 257/52; 257/57; 257/55; 257/63
[58] Field of Search ..................... 257/55, 57, 63, 257/52

[56] References Cited

U.S. PATENT DOCUMENTS

| | | |
|---|---|---|
| 4,532,198 | 7/1985 | Saitoh et al. .......................... 257/55 |
| 4,799,968 | 1/1989 | Watanabe et al. .................... 257/55 |
| 4,910,153 | 3/1990 | Dickson ................................. 437/4 |
| 5,371,380 | 12/1994 | Saito et al. ............................ 257/52 |

FOREIGN PATENT DOCUMENTS 5291136  11/1993  Japan .

OTHER PUBLICATIONS

Technical Digest, 7th International Photovoltaic Science and Engineering Conference, Nov. 22–26, 1993, Nagoya, Japan, 4 pages (including cover page; page of table of contents; and pp. 273–274).

*Primary Examiner*—Mahshid D. Saadat
*Assistant Examiner*—T. M. Arroyo
*Attorney, Agent, or Firm*—Darby & Darby

[57] ABSTRACT

The content of bonding hydrogen in an a - SiGe film is so adjusted that in a case where the content of bonding hydrogen per Si atom in the film is in the range of approximately 8 to 14 at. %, [SiH$_2$]/[Si] and [SiH]/[Si] are respectively in the ranges of approximately 0.5 to 4 at. % and approximately 7 to 10 at. %, and both [SiH$_2$]/[Si] and [SiH]/[Si] increase at approximately equal slops as the content of bonding hydrogen increases.

12 Claims, 7 Drawing Sheets

F I G. 2
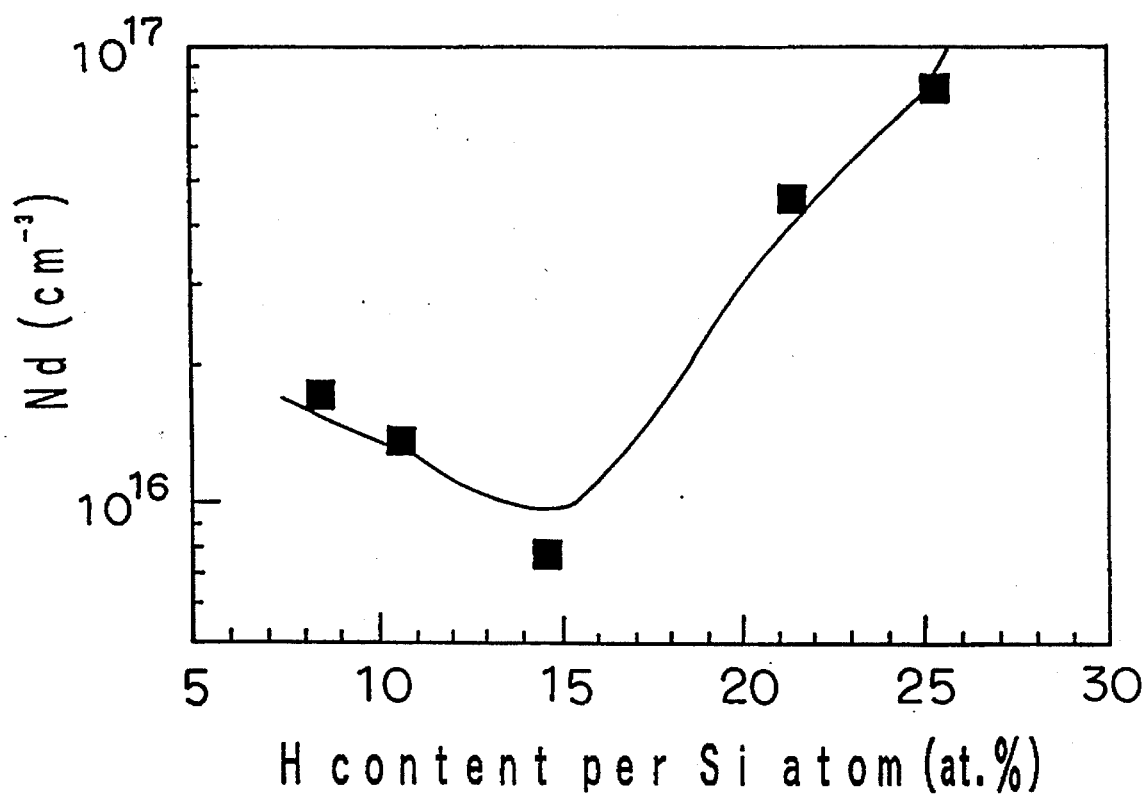

AMORPHOUS SILICON GERMANIUM FILM AND SEMICONDUCTOR DEVICE USING THE SAME

BACKGROUND OF THE INVENTION

1. Field of the Invention

The present invention relates to amorphous silicon germanium (hereinafter referred to as a - SiGe) films used for semiconductor devices such as a solar cell, a light sensor, a thin film transistor and other types of semiconductor devices using the a - SiGe films.

2. Description of the Prior Art

It is necessary that a photovoltaic device, such as a solar cell or a light sensor semiconductor device can sufficiently absorb incident light so as to improve light sensitivity over a desired wavelength sensitivity region.

Particularly, it is important that the solar cell has absorption characteristics covering a wavelength included in incident light. In recent years, an amorphous semiconductor material has been commonly used as a semiconductor material for the solar cell. The reason for this is that the absorption characteristics of the amorphous semiconductor material can be relatively easily controlled.

The most typical example of the amorphous semiconductor material is an amorphous silicon (hereinafter referred to as a - Si) film.

FIG. 7 is a device structure of a general photovoltaic device composed of an a - Si film. In FIG. 7, a transparent substrate 1 is a supporting member of the photovoltaic device, and is composed of glass or the like. A transparent conductive film 2 for introducing light incident through the substrate 1 into a power generating portion, as described later, serving as one electrode of the photovoltaic device is formed on the transparent substrate 1. The transparent conductive film 2 is composed of ITO, SnO$_2$ or the like.

A power generating portion (SC) is formed on the transparent conductive film 2. The power generating portion (SC) has a laminated body of a p-type a - Si layer (p), an intrinsic a - Si layer (i) and an n-type a - Si layer (n). A metal electrode portion 3 serving as the other electrode of the photovoltaic device is formed on the power generating portion (SC). The metal electrode portion 3 is composed of aluminum, chromium or the like.

According to the photovoltaic device of the above described construction, the incident light is mainly absorbed by the intrinsic a - Si layer (i), and electrons and holes are generated in the intrinsic a - Si layer (i) and are respectively taken out of the metal electrode portion 3 and the transparent conductive film 2 by an internal electric field formed by the p-type a - Si layer (p) and the n-type a - Si layer (n).

In this type of photovoltaic device, therefore, the optical properties and particularly, the optical band gap of the intrinsic a - Si layer mainly determines a wavelength region of light which can be absorbed. Accordingly control of the optical properties of the a - Si film in such a portion is important.

Therefore, as the amorphous semiconductor material in the intrinsic portion, an a - SiGe film having a narrow optical band gap is used so as to absorb more light in a long wavelength region.

FIG. 8 is a diagram showing a device structure of another prior art photovoltaic device. Although the above described photovoltaic device shown in FIG. 7 absorbs light only by one intrinsic amorphous semiconductor, the photovoltaic device shown in FIG. 8 uses two intrinsic amorphous semiconductors and the intrinsic amorphous semiconductors on the side of light incidence (i1) and on the side of light transmission (i2) are respectively constituted by an a - Si film and an a - SiGe film so as to make the respective light absorption characteristics of the intrinsic amorphous semiconductors different from each other. In FIG. 8, the same portions as those shown in FIG. 7 are assigned the same reference numerals.

By the above described construction of FIG. 8, light incident from a substrate is first absorbed by a first light generating portion (SC1), and light which is not absorbed by the light generating portion (SC1) is absorbed by a second light generating portion (SC2). Particularly, the second light generating portion (SC2) is constituted by an a - SiGe film having a narrow optical band gap, thereby to make it possible to sufficiently absorb light in a long wavelength region which cannot be absorbed by the first light generating portion (SC1).

Such a photovoltaic device constructed by layering a plurality of light generating portions (SC) is generally referred to as a multi-junction solar cell, which is described in detail in Japanese Patent Publication No. 48197/1988, for example.

As described in the foregoing, the amorphous semiconductor material has the advantage in that the optical band gap can be changed into various values by doping an element such as germanium (Ge), nitrogen (N), carbon (C) or tin (Sn) into the a - Si film, while having the disadvantage in that the quality of the film is degraded by doping the element, as compared with the quality of the a - Si film into which no element is doped.

Particularly in an a - Si series material, it has been found that the content of hydrogen in the film and its bonding configuration exert an important effect on film properties. In the a - SiGe film into which Ge is doped, however, the doped Ge hydrogen in the film are subtly each other, whereby control of the element becomes complicated.

The fact that the probability of bonding between hydrogen and Si is larger by approximately ten times than the probability of bonding between hydrogen and Ge in the a - SiGe film containing not more than 50% Ge is considered the cause.

In order to solve such a problem, therefore, a method of alternately forming an a - SiGe film and performing hydrogen plasma processing to improve the film quality has been tried (see Japanese Patent Laid-Open Gazette No. 84512/1987).

In the conventional method, however, it cannot be desired to rapidly improve the film quality for the decrease in productivity, and it is difficult to control the behavior of hydrogen in the film, whereby the fundamental solution has not been achieved.

SUMMARY OF THE INVENTION

The present invention has been made in view of the foregoing circumstances and has for its object to provide an a - SiGe film having suitable physical properties and having very few defects without decreasing productivity and a semiconductor device using the a - SiGe film.

An a - SiGe film according to the present invention is characterized by having a hydrogen content in a range determined on the basis of at least three conditions selected from five conditions, that is, the content of bonding hydrogen in the film, the content of a silicon-hydrogen bond per Si atom (hereinafter referred to as [H (Si)]/[Si]) in the film, the content of bonding hydrogen in an SiH mode per Si atom (hereinafter referred to as [SiH]/[Si]) in the film, the content of bonding hydrogen in an $SiH_2$ mode per Si atom (hereinafter referred to as $[SiH_2]/[Si]$) in the film, and the content of a germanium-hydrogen bond per Ge atom (hereinafter referred to as [H (Ge)]/[Ge]) in the film.

Specifically, it is possible to obtain a film in which the defect density can be significantly decreased by paying attention to a predetermined relationship between $[SiH_2]/[Si]$ in the film and [SiH]/[Si] in the film. Further, it is possible to obtain an a - SiGe film having good photoelectric properties by paying attention to the content of bonding hydrogen per Si atom and the content of bonding hydrogen per Ge atom in the film as a function of bonding hydrogen content in the film.

For example, it is assumed that in a case where the content of bonding hydrogen per Si atom in the film is in the range of approximately 8 to 18 at. %, $[SiH_2]/[Si]$ and [SiH]/[Si] are respectively in the ranges of approximately 0.5 to 7 at. % and approximately 7 to 10.5 at. %, and both $[SiH_2]/[Si]$ and [SiH]/[Si] increase as the content of bonding hydrogen increases.

It is possible to obtain a film in which the defect density is significantly decreased by thus paying attention to a predetermined relationship between $[SiH_2]/[Si]$ in the film and [SiH]/[Si] in the film.

For example, it is assumed that in a case where the content of bonding hydrogen per Si atom in the film is in the range of approximately 8 to 14 at. %, $[SiH_2]/[Si]$ and [SiH]/[Si] are respectively in the ranges of approximately 0.5 to 4 at. % and approximately 7 to 10 at. %, and both $[SiH_2]/[Si]$ and [SiH]/[Si] increase at approximately equal slops as the content of bonding hydrogen increases.

In this case, it is possible to significantly decrease the defect density in the film by paying attention to a predetermined relationship between $[SiH_2]/[Si]$ in the film and [SiH]/[Si] in the film as described above, and stability to light or the like is improved because the content of bonding hydrogen is smaller than that in the above described construction.

For example, it is assumed that in a case where the content of bonding hydrogen in the film is in the range of approximately 5 to 10 at. %, [H (Si)]/[Si] and [H (Ge)]/[Ge] are respectively in the ranges of approximately 8 to 14 at. % and approximately 1 to 3 at. %.

In this case, it is possible to obtain an a - SiGe film having good photoelectric properties by paying attention to the content of bonding hydrogen per Si atom in the film and the content of bonding hydrogen per Ge atom as a function of total content of bonding hydrogen in the film.

Furthermore, in the present invention, the above described a - SiGe film is utilized as an amorphous semiconductor in a photovoltaic device which is an example of semiconductor devices, thereby to make it possible to obtain such photovoltaic properties in which sensitivity to light having a long wavelength is high. Further, the a - SiGe film is utilized as an amorphous semiconductor in a thin film transistor which is an example of semiconductor devices, thereby to make it possible to obtain such superior properties that field effect mobility is high.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a characteristic curve showing the defect density against the content of bonding hydrogen per Si atom in the a - SiGe film according to the present invention;

DESCRIPTION OF THE PREFERRED EMBODIMENTS

Figure 1:
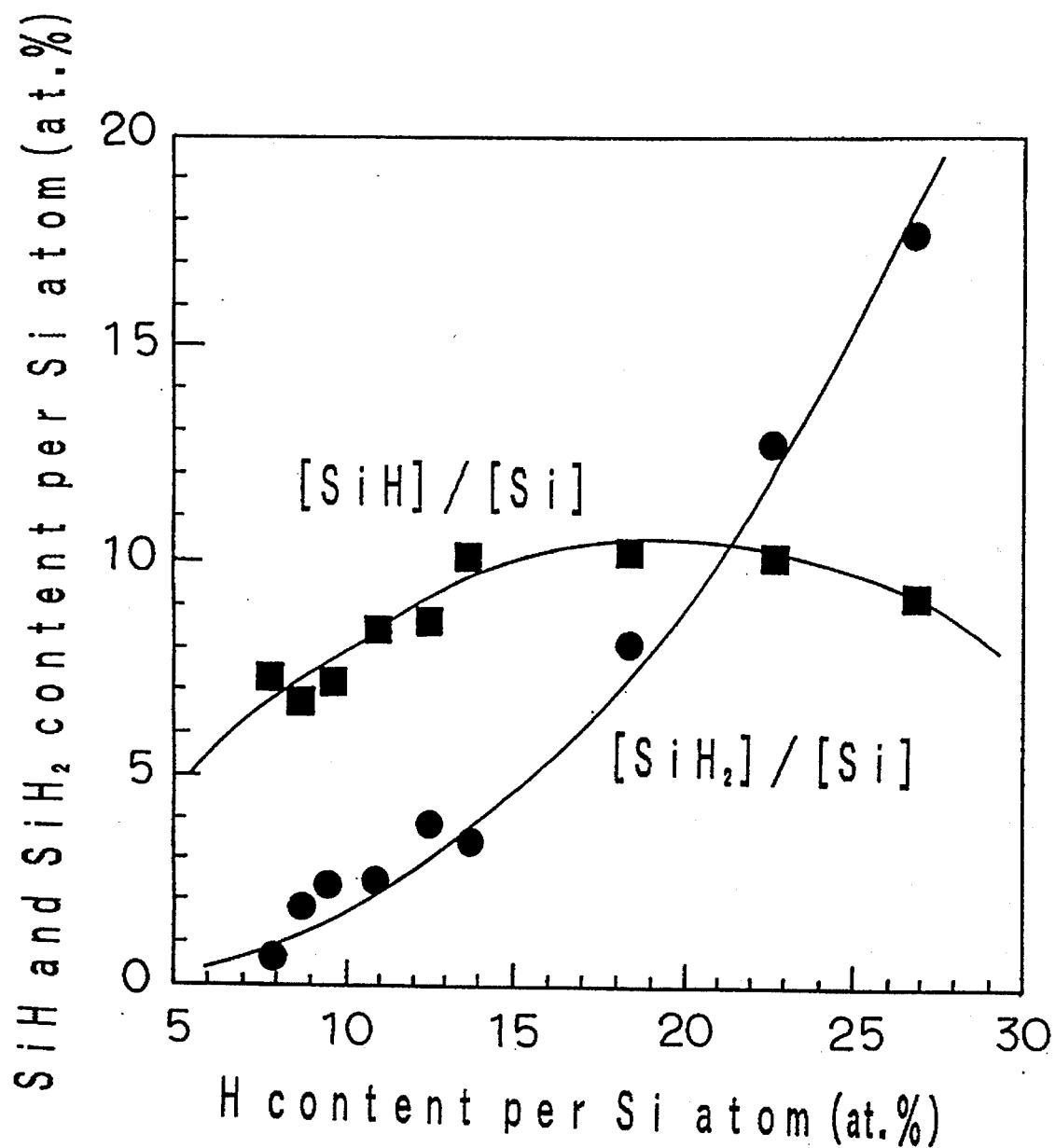
FIG. 1 is a characteristic curve showing [SiH]/[Si] and $[SiH_2]/[Si]$ against the content of bonding hydrogen per Si atom in an a-SiGe film according to the present invention.

FIG. 1 is a characteristic curve for explaining an a - SiGe film according to the present invention.

The horizontal axis in FIG. 1 represents the content of bonding hydrogen per Si atom. As a specific measuring method, secondary ion mass spectroscopy (SIMS) is used. When ions are incident on a solid, primary irradiation ions collide with atoms constituting the solid in a cascade manner in the solid, whereby the atoms constituting the solid are sputtered from the surface of the solid. Approximately 0.01 percent positive and negative ions are mixed with the sputtered atoms. A method of separating the ions utilizing the difference in mass among elements of the solid is used to analyze the elements is the SIMS.

The vertical axis represents [SiH]/[Si] and $[SiH_2]/[Si]$. The contents of bonding hydrogen were measured by determining whether or not absorption peaks exist in wave numbers of 2000 $cm^{-1}$ and 2100 $cm^{-1}$. A wide absorption band can be seen in the vicinity of 2000 $cm^{-1}$ if bonding hydrogen in the SiH mode exists, while a wide absorption band can be seen in the vicinity of 2100 $cm^{-1}$ if bonding hydrogen in the $SiH_2$ mode exists.

[SiH]/[Si] and $[SiH_2]/[Si]$ in FIG. 1 can be expressed by the following equation as a function of bonding hydrogen content per Si atom. That is, x in the equation is the content of bonding hydrogen per Si atom ($0.08 \leq x \leq 0.18$): $[SiH]/[Si]=x(4-x)^3/\{(4-x)^3+28x^2(x^2+48)\}\pm 0.01$ $[SiH_2]/[Si]= 28x^3(x^2+48)/\{(4-x)^3+28x^2(x^2+48)\}\pm 0.01$ The a - SiGe film is formed by a known plasma reaction process using a parallel plate plasma-CVD apparatus. The typical forming conditions of the a - SiGe film which is a sample to be measured in FIG. 1 are shown in Table 1. In Table 1, sccm which is a unit of the flow rate of the following reaction gas, is an abbreviation of "Standard Cubic centimeters per Minute".

TABLE 1

| substrate temperature | 150 | 350 | °C. |
|---|---|---|---|
| high frequency power | 5 | 20 | mW/cm² |
| distance between electrodes | 3 | 5 | cm |
| degree of vacuum | 10⁻⁸ | | Torr |
| pressure at reaction time | 0.1 | 0.2 | Torr |
| reaction gas SiH₄; | 30 | | sccm |
| GeH₄; | 1 | 6 | sccm |
| H₂; | 30 | 300 | sccm |

The effect of the increase or decrease of the content of bonding hydrogen on the film quality in an a - Si film is such an effect that photoelectric characteristics are generally decreased if the content of bonding hydrogen in the $SiH_2$ mode in the film is too large, the structural flexibility of an Si network in the film is decreased so that the defect density in the film is increased if the content of bonding hydrogen in the SiH mode in the film is too small. It is considered that such an effect is reflected to some extent also in the a - SiGe film.

As can be seen from FIG. 1, $[SiH_2]/[Si]$ increases as the content of bonding hydrogen per Si atom increases, while rapidly increasing from the vicinity of a point where the content of bonding hydrogen exceeds approximately 20 at. %. On the other hand, [SiH]/[Si] tends to increase as the content of bonding hydrogen increases, while tending to decrease after it has a peak in the vicinity of a point where the content of bonding hydrogen is approximately 15 to 20 at. %.

FIG. 2 is a graph corresponding to FIG. 1. In the graph of FIG. 2, the a - SiGe film formed by the typical forming conditions shown in Table 1 is used as a sample to be measured, the horizontal axis represents the content of bonding hydrogen per Si atom representing the content of bonding hydrogen per Si atom, $[SiH_2]/[Si]$ and [SiH]/[Si], and the vertical axis represents the results obtained in measuring the defect density (Nd) in the film. In other words, FIG. 2 shows the defect density in the a - SiGe film in which $[SiH_2]/[Si]$ is approximately 1.5 at. % and [SiH]/[Si] is approximately 7.5 at. % if the content of bonding hydrogen per Si atom is 10 at. %, for example.

The defect density in the film is calculated on the basis of photo-conductivity measured by a constant photocurrent method (CPM).

As can be seen from FIG. 2, the defect density in the film is gradually decreased in a region to a point where the content of bonding hydrogen on the horizontal axis is approximately 14 at. %, while rapidly increasing in a region from a point where the content of bonding hydrogen exceeds approximately 14 at. %. Even if the content of bonding hydrogen exceeds approximately 14 at. %, the defect density in the film which is not more than approximately the same as the defect density in the film at a point where the content of bonding hydrogen is approximately 8 at. % is obtained until the content of bonding hydrogen is approximately 18 at. %.

From the results of FIGS. 1 and 2, it is possible to obtain as the a - SiGe film a film in which the defect density is significantly decreased if in a case where the content of bonding hydrogen per Si atom is in the range of approximately 8 to 18 at. %, $[SiH_2]/[Si]$ and [SiH]/[Si] are respectively in the ranges of approximately 0.5 to 7 at. % and approximately 7 to 10.5 at. %, and both $[SiH_2]/[Si]$ and [SiH]/[Si] increase as the content of bonding hydrogen increases.

Furthermore, also when a film in which in a case where the content of bonding hydrogen per Si atom is in the range of approximately 8 to 14 at. %, $[SiH_2]/[Si]$ and [SiH]/[Si] are respectively in the ranges of approximately 0.5 to 4 at. % and approximately 7 to 10 at. % and particularly $[SiH_2]/[Si]$ and [SiH]/[Si] increase at approximately equal slopes as the content of bonding hydrogen increases, the defect density in the film is significantly decreased.

The reason why $[SiH_2]/[Si]$ and [SiH]/[Si] are so set as to increase at approximately equal slops as the content of bonding hydrogen per Si atom increases is by the following consideration. First, a case where [SiH]/[Si] tends to decrease as the content of bonding hydrogen increases (corresponding to a case where the content of bonding hydrogen exceeds 18 at. %) is not preferable in terms of the defect density in the film shown in FIG. 2. In a case where the slopes greatly differ even if both $[SiH_2]/[Si]$ and [SiH]/[Si] increase as the content of bonding hydrogen increases (corresponding to a case where the content of bonding hydrogen is in the range of approximately 14 at. % to 18 at. %), the content of bonding hydrogen is large even if the defect density is the same. Consequently, stability to light or the like may not be sufficiently obtained, as compared with a case where the content of bonding hydrogen is small, for example, approximately 8 to 14 at. %.

Specifically, the inventors have considered that for the a - SiGe film according to the present invention, the content of bonding hydrogen in the film must be taken into account as a parameter. For example, it is considered from FIG. 1 that an a - SiGe film in which $[SiH_2]/[Si]$ is approximately 1.5 at. % and [SiH]/[Si] is approximately 7.5 at. % if the content of bonding hydrogen is approximately 10 at. % is suitable, and an a - SiGe film in which $[SiH_2]/[Si]$ is approximately 3.5 at. % and [SiH]/[Si] is approximately 9.5 at. % if the content of bonding hydrogen is approximately 14 at. % is suitable.

Description is now made of the relationships between hydrogen and Si and hydrogen and Ge in the a - SiGe film.

Figure 3:
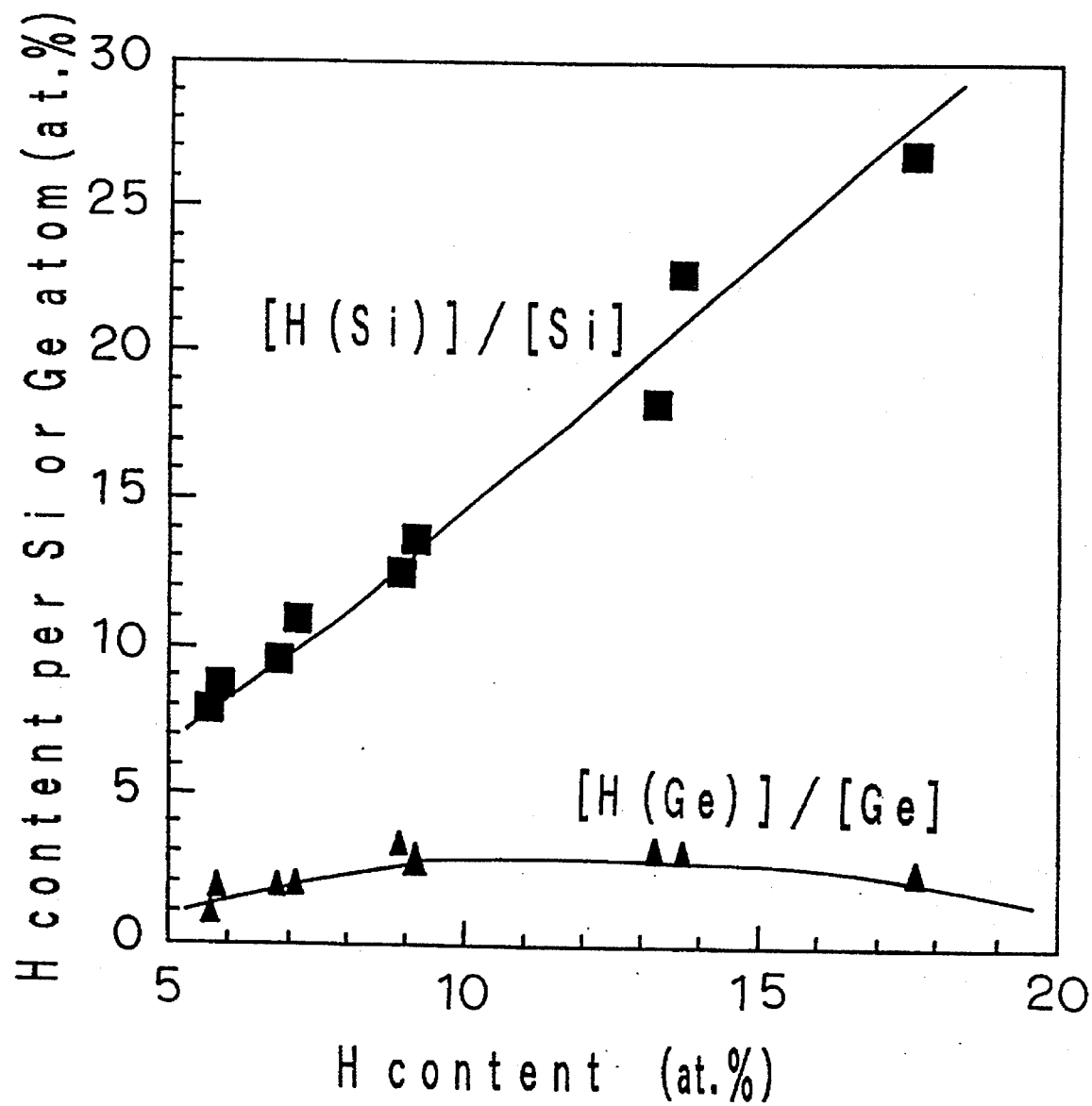
FIG. 3 is a characteristic curve showing [H (Si)]/[Si] and [H (Ge)]/[Ge] in the a - SiGe film according to the present invention as a function of bonding hydrogen content in the film.

FIG. 3 is a characteristic curve showing [H (Si)]/[Si] and [H (Ge)]/[Ge] in the a - SiGe film according to the present invention as a function of bonding hydrogen content in the film. The a - SiGe film shown in FIG. 3 contains 30 to 45% Ge, and the specific film forming conditions are shown in Table 2.

TABLE 2

| substrate temperature | 100 | 150 | °C. |
|---|---|---|---|
| high frequency power | 5 | 20 | mW/cm² |
| pressure at reaction time | 0.1 | 0.2 | Torr |
| reaction gas SiH₄; | 50 | | sccm |
| GeH₄; | 2 | 5 | sccm |
| H₂; | 500 | 1000 | sccm |
| annealing temperature | 250 | 350 | °C. |
| annealing time | 30 | 60 | min |

In forming this film, a mixed gas of reaction gases $SiH_4$ and $GeH_4$ is decomposed by a parallel plate-type high-frequency plasma CVD process, to form the film in a thickness of approximately 2000 Å at a deposition rate of approximately 50 Å/min. Thereafter, the film is subjected to annealing under the conditions shown in Table 2 under vacuum, to prepare a sample.

[H (Si)]/[Si] and [H (Ge)]/[Ge] shown in FIG. 3 are respectively measured using the sum of absorption peaks in the vicinity of wave numbers of 2000 cm⁻¹ and 2100 cm⁻¹ in infrared absorption spectoroscopy and using an absorption peak in the vicinity of a wave number of 1880 cm⁻¹.

As can be seen from FIG. 3, the quantity [H (Ge)]/[Ge] changes only slightly while [H (Si)]/[Si] substantially increases, as the content of bonding hydrogen increases.

[H (Si)]/[Si] in FIG. 3 can be expressed by the following equation as a function of bonding hydrogen content in the film. Here, X in the equation is the content of bonding hydrogen per Si atom (0.05≦X≦0.1).

$$[H (Si)]/[Si]=1.5X\pm0.02$$

Figure 4:
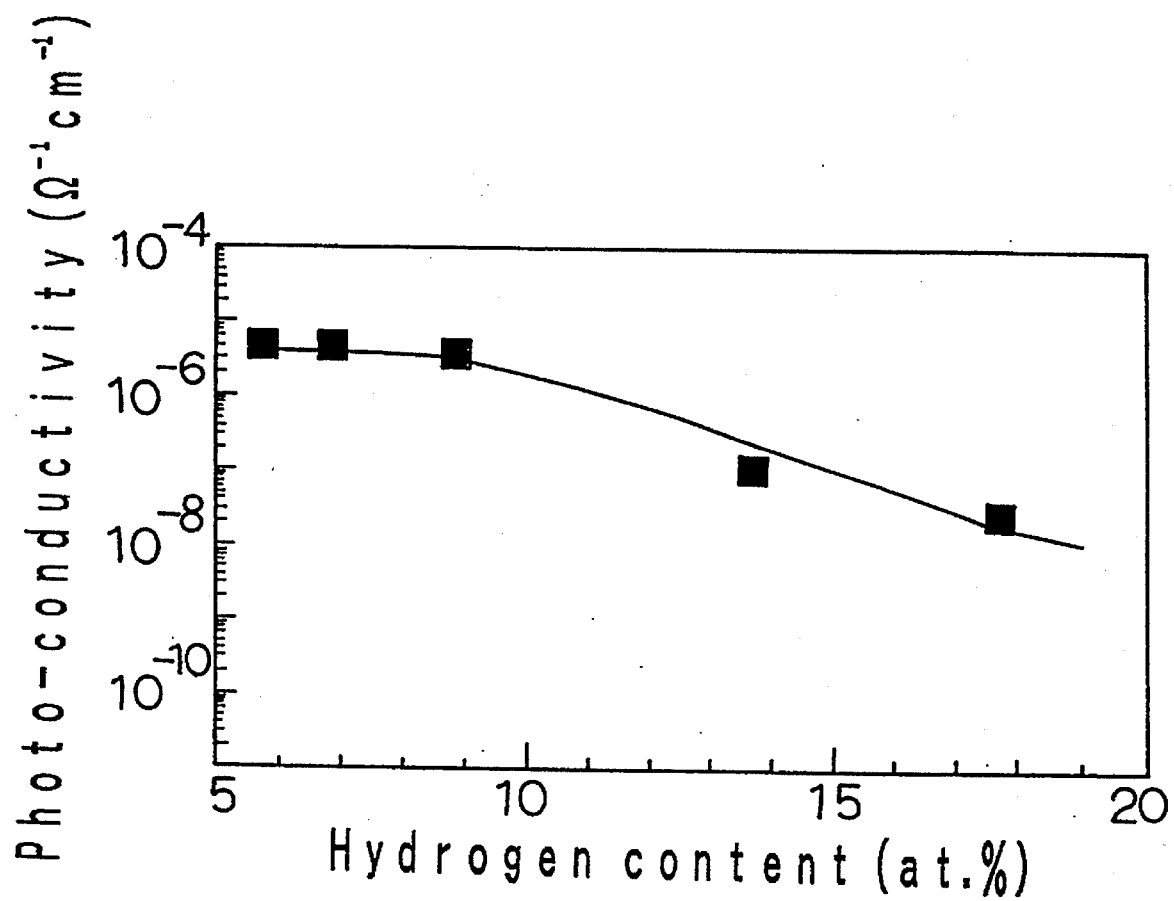
FIG. 4 is a characteristic curve showing photo-conductivity against the content of bonding hydrogen in the a - SiGe film according to the present invention.

FIG. 4 is a characteristic curve corresponding to FIG. 3. In the graph of FIG. 4, the a - SiGe film formed under the forming conditions shown in Table 2 is used as a sample to be measured, the horizontal axis represents the content of bonding hydrogen in the film, and the vertical axis represents the results obtained in measuring photo-conductivity. In other words, FIG. 4 shows photo-conductivity with respect to an a - SiGe film in which [H (Ge)]/[Ge] is approximately 1.5 at. % and [H (Si)]/[Si] is approximately 9.5 at. % if the content of bonding hydrogen in the film is approximately 7 at. %.

FIG. 4 shows that a significantly good characteristic on the order of $10^{-6}(\Omega^{-1}cm^{-1})$ is obtained if the content of bonding hydrogen is not more than 10 at. %.

As can be seen from FIGS. 3 and 4, therefore, an a - SiGe film in which in a case where the content of bonding hydrogen in the film is in the range of 5 to 10 at. %, [H (Si)]/[Si] is approximately 8 to 14 at. % and [H (Ge)]/[Ge] is approximately 1 to 3 at. % has good photo-conductivity. Also in this case, the relationship between the contents of the bonds is such a relationship that a suitable a - SiGe film can be obtained by setting the content of bonding hydrogen as a parameter.

The inventors have considered over the above described results that the non-uniformity of the microstructure of the film is alleviated, and therefore the number of defects in the film by decreasing the probability of adhesion of hydrogen to Si in the film, whereby the photo-conductivity can be improved. Further, it is found that in a case where the content of bonding hydrogen in the a - SiGe film according to the present invention is in the range of approximately 5 to 10 at. %, the ratio of the probability of adhesion of Si to hydrogen to the probability of adhesion of Ge by hydrogen is reduced to approximately three to five times, as apparent from the ratio of [H (Si)]/[Si] to [H (Ge)]/[Ge] in FIG. 3.

Figure 7:
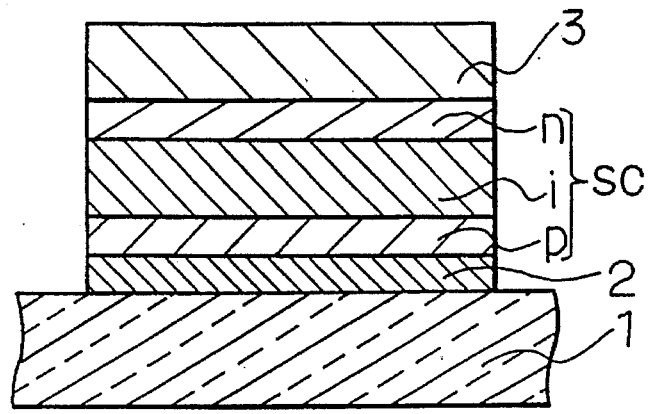
FIG. 7 is a cross sectional view showing a device structure of a photovoltaic device having a pin power generating portion.
Figure 8:
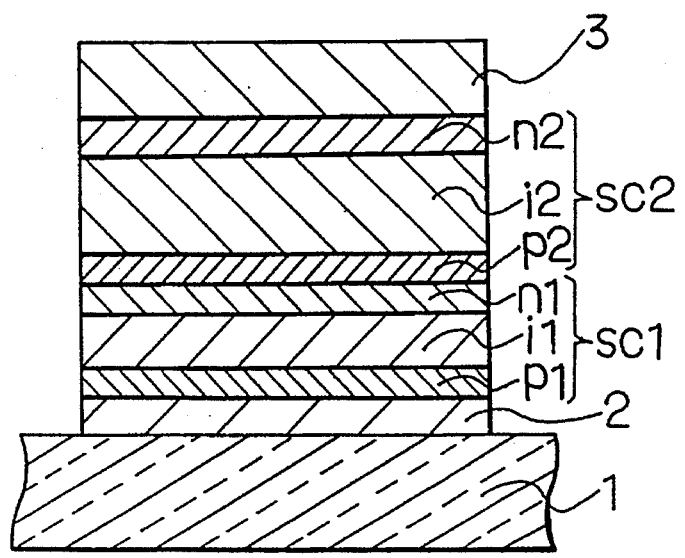
FIG. 8 is a cross sectional view showing a device structure of a photovoltaic device having two pin power generating portions.

Furthermore, the a - SiGe film according to the present invention is used as an intrinsic amorphous semiconductor in a photovoltaic device shown in FIGS. 7 and 8, thereby to make it possible to obtain a photovoltaic device superior in long wavelength sensitivity.

Additionally, the a - SiGe film according to the present invention can be also used for a thin film transistor (TFT).

Figure 5:
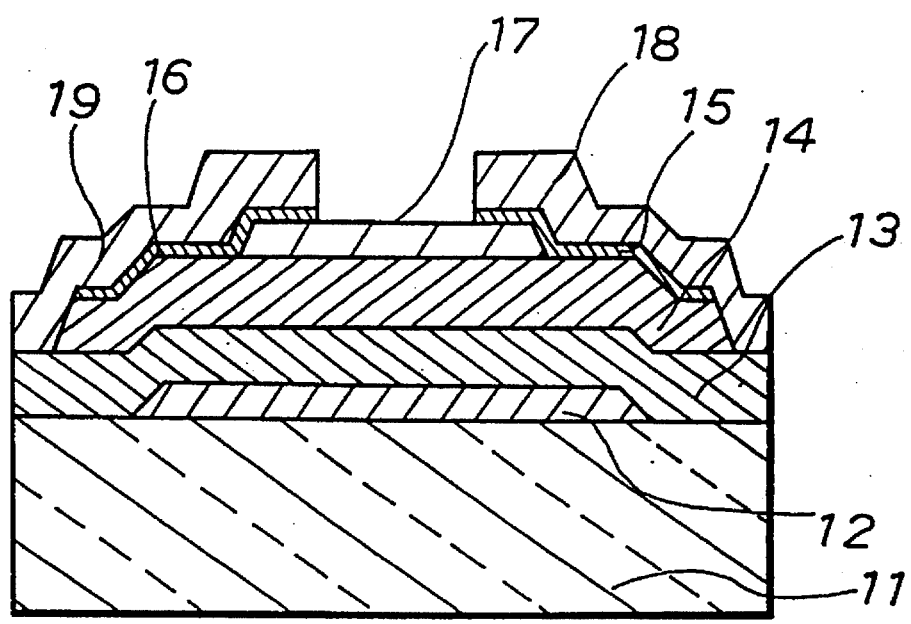
FIG. 5 is a longitudinal sectional view showing a thin film transistor using as an i channel layer the a - SiGe film according to the present invention.

FIG. 5 is a longitudinal sectional view showing a bottom gate type thin film transistor as one example of the thin film transistor. The thin film transistor is constructed by forming a gate electrode 12 and a gate insulating film 13 on a glass substrate 11, forming an i-type a - SiGe film 14 according to the present invention used as a channel layer on the gate insulating film 13, and forming a drain 15 and a source 16 and a drain electrode 18 and a source electrode 19 respectively composed of an n$^+$-type a - Si film on the right and left sides with the insulating film 17 formed on the film 14 interposed therebetween.

Figure 6:
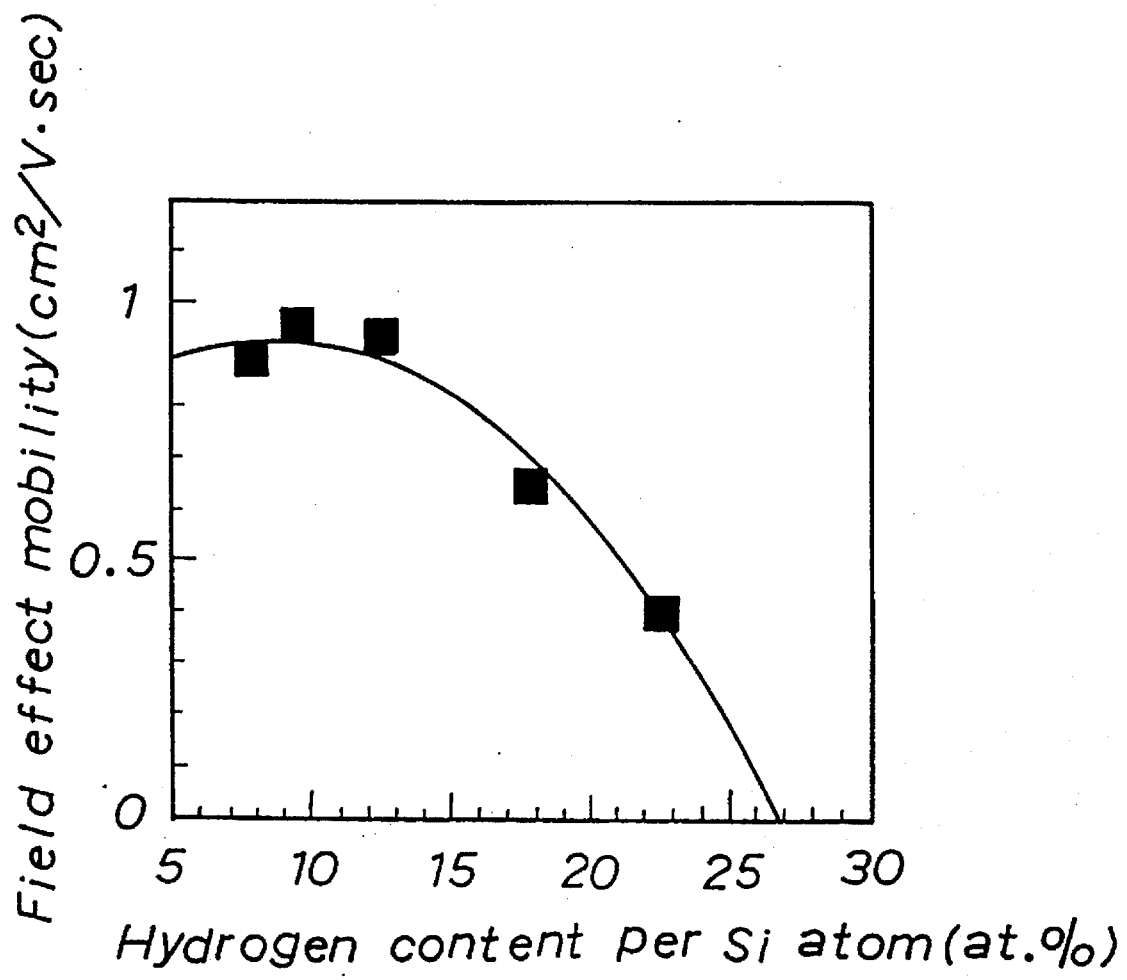
FIG. 6 is a characteristic curve showing field effect mobility against the content of bonding hydrogen per Si atom in the thin film transistor using as an i channel layer the a - SiGe film according to the present invention.

FIG. 6 is a graph showing the relationship between the field effect mobility of the thin film transistor of the above described construction in which the a - SiGe film according to the present invention is used as an intrinsic amorphous semiconductor (an i-type channel layer) and the content of bonding hydrogen per Si atom.

As can be seen from the graph of FIG. 6, high field effect mobility of approximately 1 cm$^2$/V·sec is obtained when the content of bonding hydrogen per Si atom is in the range of approximately 8 to 14 at. %, whereby the thin film transistor having such characteristics becomes suitable as a high-speed image display device material.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amorphous silicon germanium film, said film having a hydrogen content in a range determined on the basis of the content of a silicon-hydrogen bond per Si atom in the film, the content of bonding hydrogen in an SiH mode per Si atom in the film, and the content of bonding hydrogen in an SiH$_2$ mode per Si atom in the film, such that with said content of bonding hydrogen per Si atom in the film being in the range of from 8 to 18 at. %, and said content of bonding hydrogen in the SiH$_2$ mode per Si atom in the film and said content of bonding hydrogen in the SiH mode per Si atom in the film being, respectively, in the ranges of from 0.5 to 7 at. % and from 7 to 10.5 at. %, said content of bonding hydrogen in the SiH$_2$ mode per Si atom in the film and said content of bonding hydrogen in the SiH mode per Si atom in the film both increase as said content of bonding hydrogen per Si atom in the film increases.

2. The amorphous silicon germanium film according to claim 1, wherein with said content of bonding hydrogen per Si atom in the film in the range of from 8 to 14 at. %, and said content of bonding hydrogen in the SiH$_2$ mode per Si atom in the film and said content of bonding hydrogen in the SiH mode per Si atom in the film being, respectively, in the ranges of from 0.5 to 4 at. % and from 7 to 10 at. %, both said content of bonding hydrogen in the SiH$_2$ mode per Si atom in the film and said content of bonding hydrogen in the SiH mode per Si atom in the film increase in approximately equal slopes as a function of the increase in said content of bonding hydrogen per Si atom in the film.

3. An amorphous silicon germanium film having a hydrogen content determined on the basis of the content of bonding hydrogen in the film, the content of silicon-hydrogen bond per Si atom in the film, and the content of germanium-hydrogen bond per Ge atom in the film wherein said content of bonding hydrogen in the film is in the range of from 5 to 10 at. %, said content of the silicon-hydrogen bond per Si atom in the film is in the range of from 8 to 14 at. %, and said content of the germanium-hydrogen bond per Ge atom in the film is in the range of from 1 to 3 at. %.

4. A semiconductor device having as an intrinsic semiconductor layer an amorphous silicon germanium film having a hydrogen content in a range determined on the basis of the content of a silicon-hydrogen bond per Si atom in the film, the content of bonding hydrogen in an SiH mode per Si atom in the film, and the content of bonding hydrogen in an SiH$_2$ mode per Si atom in the film, said amorphous silicon germanium film being constructed with said content of bonding hydrogen per Si atom in the film in the range of from 8 to 18 at. %, and said content of bonding hydrogen in the $SiH_2$ mode per Si atom in the film and said content of bonding hydrogen in the SiH mode per Si atom in the film being, respectively, in the ranges of from 0.5 to 7 at. % and from 7 to 10.5 at %, both said content of bonding hydrogen in the $SiH_2$ mode per Si atom in the film and said content of bonding hydrogen in the SiH mode per Si atom in the film increasing as said content of bonding hydrogen per Si atom in the film increases.

5. The semiconductor device according to claim 4, wherein said amorphous silicon germanium film has said content of bonding hydrogen per Si atom in the film in the range of from 8 to 14 at. %, said content of bonding hydrogen in the $SiH_2$ mode per Si atom in the film and said content of bonding hydrogen in the SiH mode per Si atom in the film, respectively, in the ranges of from 0.5 to 4 at. % and from 7 to 10 at. %, and both said content of bonding hydrogen in the $SiH_2$ mode per Si atom in the film and said content of bonding hydrogen in the SiH mode per Si atom in the film increase at approximately equal slopes as a function of the increase in said content of bonding hydrogen per Si atom in the film.

6. A semiconductor device having as an intrinsic semiconductor layer an amorphous germanium film having a hydrogen content determined on the basis of the content of bonding hydrogen in the film, the content of silicon-hydrogen bond per Si atom in the film, and the content of germanium-hydrogen bond per Ge atom in the film wherein said amorphous silicon germanium film has said content of bonding hydrogen in the film in the range of from 5 to 10 at. %, said content of the silicon-hydrogen bond per Si atom in the film is in the range of from 8 to 14 at. %, and said content of the germanium-hydrogen bond per Ge atom in the film is in the range of from 1 to 3 at. %.

7. The semiconductor device according to claim 4, wherein said semiconductor device is a photovoltaic device, said amorphous silicon germanium film intrinsic semiconductor layer being positioned to receive light incident on said device.

8. The semiconductor device according to claim 5, wherein said semiconductor device is a photovoltaic device, said amorphous silicon germanium film intrinsic semiconductor layer being positioned to receive light incident on said device.

9. The semiconductor device according to claim 6, wherein said semiconductor device is a photovoltaic device, said amorphous silicon germanium film intrinsic semiconductor layer being positioned to receive light incident on said device.

10. The semiconductor device according to claim 4, wherein said semiconductor device is a thin film transistor including a channel layer comprising said amorphous silicon germanium film intrinsic semiconductor layer.

11. The semiconductor device according to claim 5, wherein said semiconductor device is a thin film transistor including a channel layer comprising said amorphous silicon germanium film intrinsic semiconductor layer.

12. The semiconductor device according to claim 6, wherein said semiconductor device is a thin film transistor including a channel layer comprising said amorphous silicon germanium film intrinsic semiconductor layer.

\* \* \* \* \*